United States Patent
Schramm et al.

(10) Patent No.: US 6,762,958 B2
(45) Date of Patent: Jul. 13, 2004

(54) SEMICONDUCTOR MEMORY WITH PRECHARGE CONTROL

(75) Inventors: Achim Schramm, München (DE); Helmut Schneider, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/200,902

(22) Filed: Jul. 23, 2002

(65) Prior Publication Data

US 2003/0016564 A1 Jan. 23, 2003

(30) Foreign Application Priority Data

Jul. 23, 2001 (DE) .......................................... 101 35 814

(51) Int. Cl.[7] .............................................. G11C 7/00
(52) U.S. Cl. .............................. 365/189.07; 365/189.11; 365/228
(58) Field of Search ...................... 365/189.07, 189.11, 365/202, 203, 222, 228, 210, 205, 207, 225.7, 190

(56) References Cited

U.S. PATENT DOCUMENTS

| 5,703,824 | A | * | 12/1997 | Isa ........................... 365/225.7 |
| 5,745,421 | A | | 4/1998 | Pham et al. ................. 365/203 |
| 6,201,742 | B1 | * | 3/2001 | Hirai et al. ............ 365/189.09 |
| 6,351,422 | B2 | * | 2/2002 | Rohr et al. .................. 365/203 |

* cited by examiner

*Primary Examiner*—Gene Auduong
(74) *Attorney, Agent, or Firm*—Laurence A. Greenberg; Werner H. Stemer; Ralph E. Locher

(57) ABSTRACT

The application of a nonactive level to a word line in a semiconductor memory is controlled by a precharge control. In order to initiate the precharge operation, a pair of reference bit lines are provided to which initially different potentials can be fed, which are subsequently amplified by a reference sense amplifier. The potential of one of the reference bit lines is amplified in a differential amplifier in order thereupon to cause a control device to initiate the precharge operation.

6 Claims, 2 Drawing Sheets

SEMICONDUCTOR MEMORY WITH PRECHARGE CONTROL

BACKGROUND OF THE INVENTION

Field of the Invention

The invention relates to a semiconductor memory having a memory cell array and a multiplicity of word and bit lines and memory cells connected to the word and bit lines. The word lines can be driven by an active and a nonactive level. A control device is provided in order to cause the outputting of the nonactive level to the word lines.

Random access semiconductor memories, in particular having dynamic memory cells, so-called DRAMS (Dynamic Random Access Memories), have word lines and bit lines with memory cells arranged at their crossover points. A dynamic memory cell comprises a storage capacitor and a selection transistor. The control terminal of the selection transistor is connected to the word line. The controlled path of the selection transistor is connected to the storage capacitor at one end and to the bit line at the other end.

In the event of an access to a memory cell, for example a read access, the word line is activated by the application of an active level, so that the transistor is turned on. The storage capacitor is thereby connected to the bit line and outputs its charge onto the bit line. A sense amplifier subsequently amplifies the signal output from the storage capacitor to the bit line to form a full-level signal. The signal amplified by the sense amplifier is subsequently forwarded along the read-out data signal path as far as an output terminal, in order to be ready at the output of the semiconductor memory.

The charge content of the capacitor decreases on account of leakage currents. Therefore, the charge content in dynamic memories must be refreshed at predetermined time intervals. For this purpose, the signal amplified by the sense amplifier is written back to the memory cell via the open selection transistor. Both during the read-out and during the refresh, the word lines are activated and the amplifying operation at the sense amplifier is to be carried out until there is sufficient certainty that the read-out data value is present with a sufficiently stable level at the sense amplifier. Afterward, the activated word line can be deactivated again. In this case, a nonactive level, for example reference-ground potential or ground or even a negative level value, is output onto the word line. By contrast, the active level has a positive potential which is generated by means of voltage pumps in a manner even lying above the supply voltage fed in externally, in order that the selection transistor is completely turned on. In addition, the bit lines are precharged to an equalization level. This deactivation operation is referred to as precharge.

The correctly timed application of the nonactive level to previously selected word lines is important. If the word lines are turned off too early, so that the levels amplified on the bit lines have not yet been taken to saturation to a sufficient extent, then an only inadequately amplified signal is written back to the memory cells. The stored information is weakened as a result. In the event of a subsequent activation of such memory cells, it can happen that the stored information cannot be reestablished. On the other hand, if the turn-off of the word lines lasts too long, although there is certainty that the data signals have been amplified to a sufficiently high level, a subsequent memory access can only be effected when the word line is completely inactivated. The operating speed is reduced by a lengthy precharge operation. If the precharge operation starts too late, then precharge time is lost unnecessarily. A subsequent activation command in the same region of the memory cell array can lead, under certain circumstances, to an incorrect assessment of the cell information.

Particularly, in semiconductor memories operated clock-synchronously, so-called SDRAMs (Synchronous Dynamic Random Access Memories), the processing operations in the semiconductor memory are handled clock-synchronously, so that the precharge operation is initiated after a predetermined number of clock cycles after an activation of a memory cell. The coupling of a fixed delay time after an activation of the memory cell array for the initiation of the precharge operation has the disadvantage that the individual switching speeds of the functional elements of the semiconductor memory itself and of the entire system are not taken into account.

By way of example, a precharge operation can be initiated asynchronously after an activation of the memory cell array. For this purpose, a fixed delay time is generated on-chip for example by the charging of a capacitance. What is disadvantageous is that the exact setting of such a delay time is difficult on account of the—as is known—not inconsiderable production-dictated variation of absolute parameters of integrated components. The delay time is temperature-dependent, moreover. The current consumption caused by the charging of capacitances is not inconsiderable, moreover.

Synchronous measures count the clock pulses of the externally applied clock signal and initiate the precharge operation after a predetermined number of clock cycles have elapsed after the activation of the memory cell array. What is disadvantageous here is that the operating frequency of the semiconductor memory must be complied with as exactly as possible. If the semiconductor memory is to be operated in a relatively large operating frequency range, then it can happen at a high operating frequency that the counted clock cycles have elapsed so rapidly that the amplifying operation of the sense amplifier is not yet sufficient before the precharge operation is initiated. At a low operating frequency, it can happen that there is an unnecessarily long wait before the required number of operating clock cycles has been counted. A renewed memory access is delayed ever further in an unnecessary manner here. Furthermore, it should be taken into account that clock-synchronous semiconductor memories can co-operate with memory controllers which alter the operating frequency considerably particularly in the standby mode. These conventional concepts therefore have the disadvantage that they can either only be realized in a complex manner or cannot be adapted flexibly enough to changing operating conditions.

SUMMARY OF THE INVENTION

It is accordingly an object of the invention to provide a semiconductor memory with precharge control, which overcomes the above-mentioned disadvantages of the heretofore-known devices and methods of this general type and wherein the precharge operation is initiated at a point in time that is as optimal as possible after an access to the memory cell array, independently of the operating conditions that are currently present.

With the foregoing and other objects in view there is provided, in accordance with the invention, a semiconductor memory, comprising:

a memory cell array having a multiplicity of word lines and a multiplicity of bit lines and having a multiplicity of memory cells connected to one of the word lines and one of the bit lines, the word lines having an active level, at which an access to memory cells is possible, and a nonactive or inactive level, at which an access to memory cells is not possible;

a control device in order to allocate the nonactive level to the word lines of the memory cell array;

a first and a second reference bit line, which are connected in a switchable manner to a respective terminal for a reference potential;

a comparison device, which, on the input side, is connected to at least one of the reference bit lines and, on the output side, generates a control signal depending on which the control device is caused to apply the nonactive level to the word lines.

The semiconductor memory according to the invention controls the waiting time until initiation of the precharge operation independently of the operating clock of the semiconductor memory or independently of a fixedly predetermined delay time. Rather, the precharge operation is initiated by monitoring the amplifying the operation at the pair of reference bit lines. If it is ascertained that sufficient amplification is present, the precharge operation is initiated. This point in time is chosen such that, or the one hand, the information is written back to the memory cell after having been amplified to a sufficient extent that it can be read out without any errors in the event of the next activation, and, on the other hand, initiation is nonetheless effected as early as possible in order not to lose any unnecessary waiting time. The externally supplied operating clock of the semiconductor memory is no longer important in defining the point in time of the precharge. Although additional outlay on circuitry is required, the additional area taken up in the semiconductor chip is compensated for by the gain in operational reliability.

It is important that the reference bit lines and the conditions present thereon correspond as exactly as possible to the conditions on a normal bit line pair ready for operation. Ideally, the worst-case conditions present on a normal bit line pair are simulated on the reference bit line pair. For this purpose, the reference bit line pair is expediently arranged at the edge of a memory cell array. The bit lines are connected to reference potentials via switching elements, which may be switching transistors. The reference potentials are slightly different from one another in order, compared with an information value stored in a memory cell, to generate a slight asymmetry on the reference bit line pair. This asymmetry is subsequently amplified and assessed in order to control the initiation of the precharge operation in a manner dependent thereon. One of the reference potentials expediently lies in the center of the settled signal levels of the bit lines for the complementary information signals to be stored, that is to say in the center of a bit line high level and a bit line low level. The other of the reference potentials preferably lies above that by a voltage offset $\Delta U$. The voltage offset $\Delta U$ ideally corresponds to a stored data value which can be read from a memory cell. During the precharge operation, these reference levels are applied to the bit lines via the switching transistors. During the read-out operation, the reference levels are isolated from the bit lines, so that the amplifying process can be initiated.

In accordance with a preferred feature of the invention, only one of the reference bit lines is connected to an input of a comparison device. The comparison device may be embodied as a differential amplifier. That bit line to which the higher reference potential is applied is connected to the input of the comparison device. The other input of the comparison device is driven by the high bit line level. A switching signal is derived from the output of the comparison device and is transmitted to the superordinate control unit of the semiconductor memory. Said control unit thereupon initiates the precharge operation and generates the required control signals for the memory cell array. The control device is conventionally embodied as a state machine. In an advantageous refinement of the invention, a comparator is connected downstream of the comparison device. Another input of the comparator is controlled by a further reference potential. The comparator switches when the level on the reference bit line fed into the comparison device has risen to such an extent that the difference between this level and the high bit line level falls below a predetermined value. This predetermined value is formed by the ratio of the further reference potential to the gain factor of the differential amplifier. The switching signal which controls the state machine is present at the output of the comparator.

The provision of reference potentials which are to be applied switchably, i.e., selectively, to the reference bit lines has the advantage that the voltage offset $\Delta U$ can be set exactly during a test of the semiconductor memory. For this purpose, a voltage generator is available which is provided with fusible links, so-called fuses or antifuses. The voltage generator has, for example, a resistor network wherein resistors can be connected in or disconnected by means of the fuses/antifuses. Test methods for semiconductor memories provide for supply voltages that are fed in to be varied and for the semiconductor memories thereupon to be tested for functionality under various operating voltages. In the case of the invention, with the inclusion of these voltage tests, it is possible to determine the optimum point in time for initiating the precharge operation. From this, the optimum value for the voltage offset $\Delta U$ is determined and set by means of the fuses/antifuses.

The reference potentials are coupled in to the reference bit lines via respective transistor switches. The circuits are turned on during the precharge phase. If n-channel MOS transistors are used as switching transistors, these transistors are activated by the control signals which initiate the precharge operation.

In order to ensure an as far as possible ideal simulation of the conditions on the normal bit lines in the reference bit line pair, a number of developments are conceivable. A delay path is additionally connected downstream of the output of the comparison device or of the differential amplifier, which delay path effects an analogously asynchronously generated delay time. The delay time is a measure of the so-called write-back time. This time duration is necessary in order to write the signals amplified by the sense amplifiers of the normal bit lines back to the memory cells. By virtue of the fact that the differential amplifier is only connected to one of the reference bit lines, an asymmetrical capacitive loading of the reference bit lines may be present. The additional capacitive load caused by the input of the differential amplifier can be compensated for by an additional capacitance which is connected on the other reference bit line not connected to the differential amplifier. Finally, the reference bit line pair differs from the normal bit line pairs by virtue of the input capacitance of the differential amplifier and, if appropriate, by virtue of the additional compensating capacitance mentioned above. In order, from this standpoint, to make the conditions on the reference bit line pair equal to the conditions on the normal bit line pair, the reference bit line is dimensioned to be correspondingly shorter compared with the normal bit lines, in order to apply, in total, in each case identical capacitive loads to the sense amplifier.

It suffices in principle, to provide one reference bit line pair per memory bank. Other architectures of semiconductor memories provide even smaller organization units, so-called memory segments within a memory bank. In this case, it is possible to arrange one reference bit line pair per memory segment. A memory bank is in this case an inherently completely functional memory section which is addressed independently of another memory bank.

Other features which are considered as characteristic for the invention are set forth in the appended claims.

Although the invention is illustrated and described herein as embodied in a Semiconductor Memory With Precharge Control, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
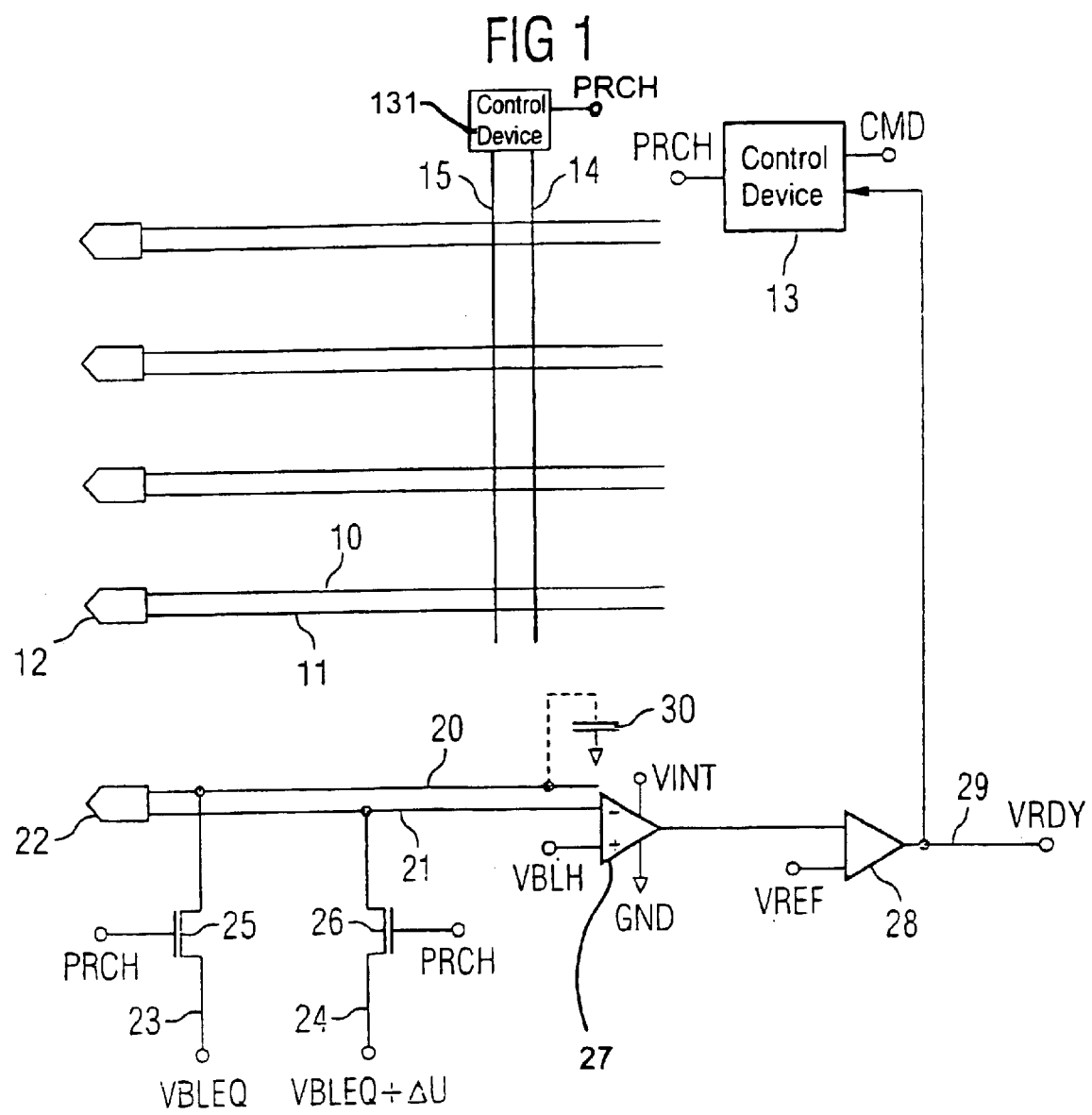
FIG. 1 is a schematic diagram of a detail from a semiconductor memory with functional elements that are relevant with regard to the invention.

Referring now to the figures of the drawing in detail and first, particularly, to FIG. 1 thereof, there is shown a detail from a memory cell array of a dynamic random access semiconductor memory (DRAM). The memory cell array has a multiplicity of normal bit line pairs, for example the bit lines designated by 10 and 11 in the normal bit line pair illustrated at the bottom, and a multiplicity of word lines 14, 15. Memory cells which store the information to be stored in noninverted form are connected to the bit line 10. Memory cells which store the information to be stored in inverted form are connected to the bit line 11.

Figure 2:
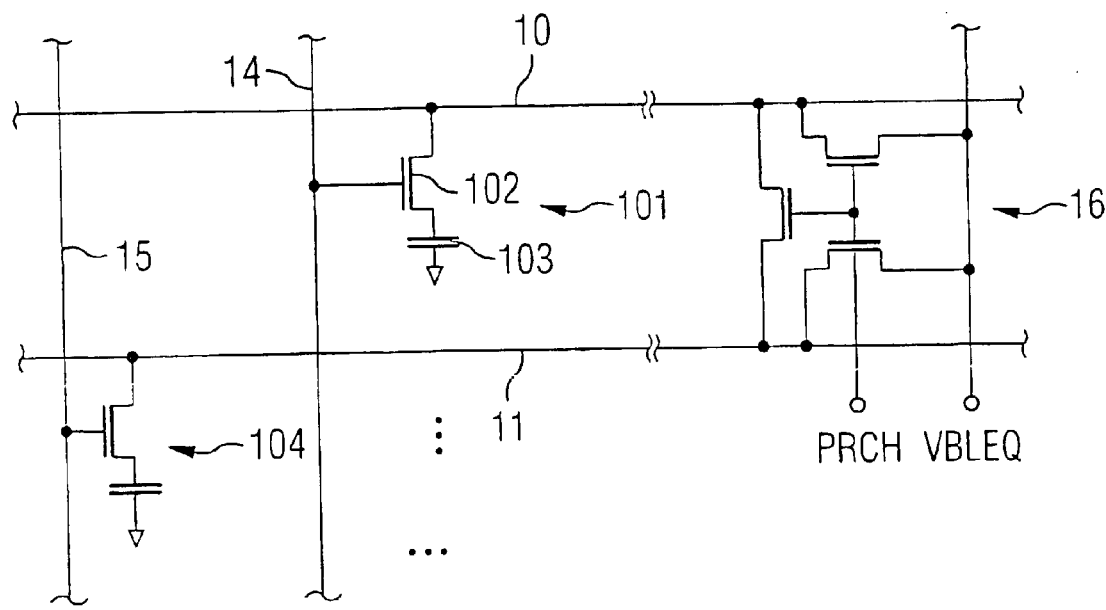
FIG. 2 is a circuit schematic of a detail from a memory cell array.

FIG. 2 illustrates a detail from the bit lines 10, 11 with respective memory cells 101, 104. A memory cell comprises a selection transistor 102 with a drain-source path through which a storage capacitor 103 is connected to the bit line 10. The gate terminal of the selection transistor 102 is connected to the word line 14. If the word line 14 is activated, the transistor 102 is turned on and the quantity of charge stored in the capacitor 103 is output onto the bit line 10. All the other memory cells are constructed identically The memory cell 104 is connected to another word line 15. The word lines can be activated in a manner dependent on an address from a word line decoder. The bit lines 10, 11 are connected to a sense amplifier 12.

The charge content stored in the capacitor 103 volatilizes on account of leakage currents. Therefore, it is necessary to ensure that the memory cell is refreshed at specific time intervals, e.g. every 64 ms (milliseconds). Similar operations proceed during the refresh and also during the read-out of a memory cell. Initially, the potential of the bit lines 10, 11 is equalized and lies at the middle level VBLEQ between the settled, saturated signal levels of the bit lines VBLH and VBLL that represent a logic "1" and a logic "0". The selection transistor of a memory cell to be accessed is then activated by the application of an active level to the word line, and the charge content stored in the storage capacitor slightly deflects the symmetrical levels of the bit lines that were present until then. This slight asymmetry is amplified by the sense amplifier. On account of the capacitive loads and finite gain of the sense amplifier, it takes a certain time for the levels of the complementary bit lines 10, 11 to be amplified to a sufficient extent. Furthermore, it takes a certain period of time before the levels amplified by the sense amplifier 12 have been written back to the memory cell 103 (write-back time). Finally, the memory cell 101 is refreshed so the signal level present at the sense amplifier 12 can be forwarded for the read-out. Afterward, the word line 14 is deactivated again and pulled to ground potential or a slightly negative potential by a control device 131, which receives a precharge control signal PRCH from the control device 13. The bit lines are brought to the equalization potential VBLEQ again. A precharge circuit 16 controlled by the precharge control signal PRCH is used for this purpose. The deactivation of the word line and the equalization of complementary bit lines is referred to as the precharge operation. On the one hand, the precharge operation must not be initiated too early, since in this case the levels are not amplified to a sufficient extent and the memory cell is not completely refreshed. During subsequent read-out operations, the incorrect data value can be read out. On the other hand, the precharge operation should not be initiated too late, since operating speed is then lost.

Figure 3:
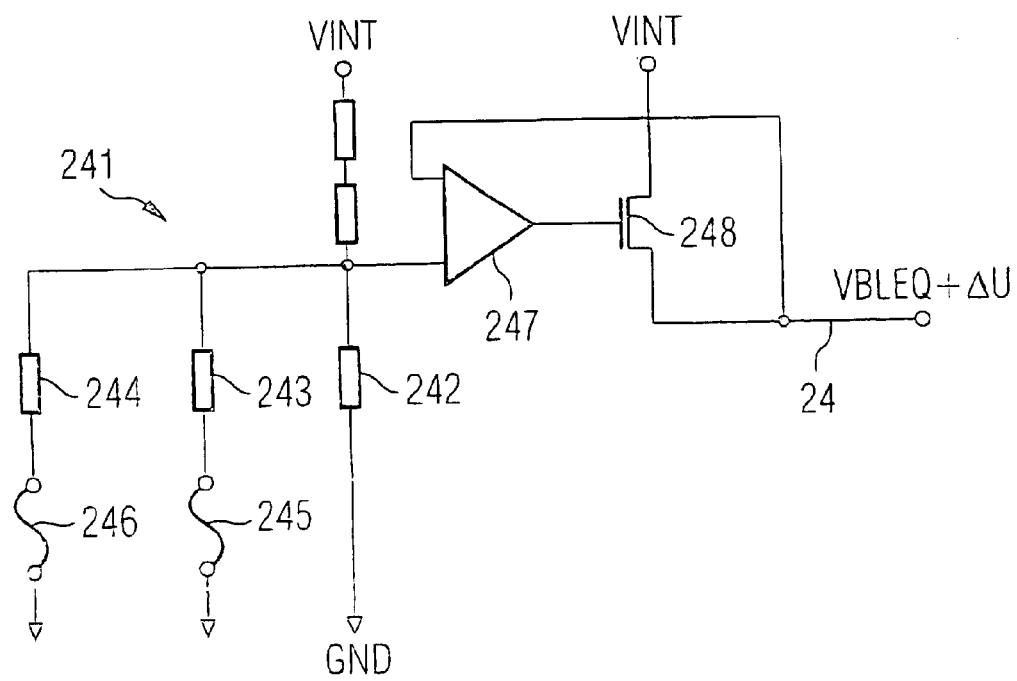
FIG. 3 is a circuit schematic of a voltage generator for generating one of the reference potentials that occur in the circuit of FIG. 1.

Complementary reference bit lines 20, 21 are provided in order to determine the point in time that is as optimal as possible for the initiation of the precharge operation. The reference bit lines are connected to a reference sense amplifier 22. Connected to the reference bit lines 20, 21 is a respective switching transistor 25, 26, via which the equalization potential VBLEQ can be applied to the first reference bit line 20 and a potential VBLEQ+ΔU, slightly offset relative to the equalization potential VBLEQ, can be applied to the second reference bit line 21. Respective terminals 23, 24 are provided for feeding in these potentials. A voltage generator for generating the potential VBLEQ+ΔU is illustrated in FIG. 3. The transistors 25, 26 are controlled by the control signal PRCH which initiates the precharge operation. The saturated high level of the bit lines is designated by VBLH. The saturated low level of the bit lines is designated by VBLL. The equalization potential VBLEQ lies in the center between VBLH and VBLL. The potential VBLEQ+ΔU lies slightly above said center orientated toward the high potential VBLH. The voltage offset ΔU approximately corresponds to the voltage level for a logic "1" that is output onto the bit line from a memory cell during read-out.

At the end of the precharge operation, the transistors 25, 26 are turned off and the reference sense amplifier 22 is activated. It amplifies the asymmetry initially introduced onto the bit lines 20, 21 through the voltage offset ΔU. The bit line 21 is therefore amplified in the direction of the potential VBLH and the bit line 20 in the direction of the potential VBLL. A differential amplifier 27 serving as comparison device is connected to the bit line 21. The inverting input of the differential amplifier 27 is connected to the bit line 21. The noninverting input of the differential amplifier 27 is driven by the potential VBLH. The differential amplifier is operated by the customary supply voltage VINT, GND. The differential amplifier 27 amplifies the signal fed from the reference bit line 21 by a gain factor, for example of 10. The output signal of the differential amplifier 27 is again amplified, if appropriate, in a comparator 28 connected downstream, or correspondingly delayed in order to take account of the write-back time. The comparator compares the output signal of the differential amplifier 27 with a reference potential VREF. At the terminal 29, on the output side of the comparator 28, the control signal VRDY is present which is fed back into the superordinate control device 13, where it initiates the generation of the control signal PRCH for the precharge operation. The comparator 281 switches when the level of the reference bit line 21 has risen to an extent such that the difference between this level and the potential VBLH falls below the quotient VREF/gain factor of the differential amplifier. The control device 13 is a state machine which, in a manner dependent on supplied control commands CMD and in a manner dependent on the instantaneous operating state, on the output side generates a multiplicity of control signals in order to control the operation of the semiconductor memory.

As illustrated in FIG. 1, the reference bit lines 20, 21, are made shorter than the normal bit lines 10, 11 of the memory cell array. This compensates for the capacitive load additionally provided as a result of the input of the differential amplifier 27 on the bit line 21, so that the reference sense amplifier 22 has approximately the same capacitive loading as a normal sense amplifier 12. In order to compensate for the capacitive loading between the complementary reference bit lines 20, 21 a capacitor 30 is connected to the reference bit line 20 and approximately compensates for the input capacitance of the differential amplifier 27 on the other reference bit line 21.

The pair of reference bit lines 20, 21 and the associated circuits are to be provided at least once per memory bank. A memory bank is a semiconductor memory unit which is autonomously functional inherently independently of other memory banks. By way of example, the word lines 14, 15 are activated by a decoder which is assigned only to this memory bank. Word lines of other memory banks are selected independently of the word lines of this memory bank. It is likewise possible, however, to arrange the reference bit lines and assigned circuits also in repeated fashion within a memory bank and to assign them for example to each memory segment. The reference bit lines preferably lie at the edge of a memory bank or of a memory segment, since the time behavior is particularly critical there.

FIG. 3 illustrates a voltage generator for generating the voltage VBLEQ+ΔU present at the terminal 24. The voltage generator comprises, in a conventional manner, a control amplifier 247, to which, on the one hand, the voltage VBLEQ+ΔU to be generated is fed back and to which, on the other hand, a signal provided by a voltage divider 241 is fed. On the output side, the control amplifier 247 controls a transistor 248, which derives the desired potential VBLEQ+ΔU from the internal supply voltage VINT. The resistor divider has a resistor 242 which faces the reference-ground potential GND and with which further resistors 243, 244 are connected in parallel via programmable elements 245, 246. The programmable elements 245, 246 are fusible links which—as iillustrated in the exemplary embodiment—are conducting in the nonprogrammed state and are interupted in the programmed state and then constitute an open circuit (fuse). As an alternative, it is also possible to use antifuses, which are nonconducting in the nonprogrammed state and are conducting in the programmed state.

During the test of the semiconductor memory, it is conventional practice to vary internal conditions, for example supply voltages, in order to provide a reserve in a direction towards the worst-case operating conditions to be expected in normal operation The semiconductor memory is then tested for correct functionality. In connection with the invention, the optimum magnitude of the voltage offset ΔU is determined in this case. One or a plurality of the fuses 245, 246 are programmed accordingly. ΔU is set on the one hand such that the precharge operation is initiated only when the sense amplifiers have reached the saturated bit line levels VBLH, VBLL. Whilst taking account of this condition, on the other hand, the precharge operation is to be initiated as early as possible.

The voltage offset ΔU is expediently on the side of the bit line high level VBLH. The differential amplifier 27 therefore tests a sufficiently highly developed logic "1" on the reference bit line 21 by comparison with the bit line high level VBLH. Since the logic "1" of the bit lines develops more slowly compared with the logic "0", here the assessment for the initiation of the precharge operation is made dependent on the worst case. Moreover, it must be taken into account that the differential amplifier 27 is supplied by the internal supply voltage VINT and ground potential GND. The comparison potential VBLH is lower than VINT. From a circuitry point of view, such a comparison can be carried out relatively exactly. Although the alternative, where the voltage offset au lies on the side of the bit line low potential VBLL, is, conceivable, in principle, a comparable differential amplifier would be more complicated to realize or would yield a more uncertain switching decision.

What is claimed is:

1. A semiconductor memory, comprising:
   a memory cell array having a multiplicity of word lines, a multiplicity of bit lines, and a multiplicity of memory cells each connected to one of said word lines and to one of said bit lines, said word lines having an active level at which memory cell access is possible and a nonactive level at which memory cell access is not possible;
   a control device connected to said word lines;
   at least one sense amplifier;
   said bit lines being disposed in pairs and each two of said bit lines being connected to a respective sense amplifier;
   a reference sense amplifier;
   first and second reference bit lines each switchably connected to a respective terminal to carry a mutually different reference potential, said first and second reference bit lines being connected to said reference sense amplifier; and
   a comparison device having an input connected to at least one of said reference bit lines and an output connected to said control device, said comparison device generating a control signal causing said control device to apply the nonactive level to said word lines.

2. The semiconductor memory according to claim 1, which comprises respective switches connecting said terminals for the reference potentials to said reference bit lines, and wherein said control device generates a signal applying the nonactive level to said word lines, and said switches are controllable depending on the signal.

3. The semiconductor memory according to claim 1, wherein said memory cells comprise a selection transistor and a storage capacitor, said selection transistor has a drain-source path connected between said bit lines and said storage capacitor, and said selection transistor has a gate terminal connected to one of said word lines.

4. The semiconductor memory according to claim 1, wherein said sense amplifiers are configured to generate complementary bit line levels, the reference potentials include a first reference potential lying in a center of the complementary bit line levels, and a second reference potential spaced a smaller distance from the relatively higher complementary bit line level than the first reference potential.

5. The semiconductor memory according to claim 4, wherein a terminal for the second reference potential is connectible to said second reference bit line, said input of said comparison device includes, a terminal connected to said second reference bit line, and a further terminal connected to a terminal for a comparison potential equal to the higher bit line level.

6. The semiconductor memory according to claim 5, which comprises a voltage generator generating the second reference potential, said voltage generator having an output voltage adjustable depending on programmable fusible links.

* * * * *